United States Patent
Hatano et al.

(10) Patent No.: US 6,787,754 B2
(45) Date of Patent: Sep. 7, 2004

(54) SOLID-STATE IMAGE PICKUP DEVICE HAVING IMPROVED FLATNESS AND METHOD FOR FABRICATING THE SAME

(75) Inventors: Keisuke Hatano, Tokyo (JP); Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 129 days.

(21) Appl. No.: 09/855,652

(22) Filed: May 16, 2001

(65) Prior Publication Data

US 2001/0042818 A1 Nov. 22, 2001

(30) Foreign Application Priority Data

May 16, 2000 (JP) ...................................... 2000-143730

(51) Int. Cl.$^7$ ............................................. H01L 31/00
(52) U.S. Cl. ................... 250/214.1; 348/294
(58) Field of Search ......................... 200/208.1, 214.1, 200/214 R; 257/444, 446, 448, 458, 222, 225; 348/300, 301, 308

(56) References Cited

U.S. PATENT DOCUMENTS 5,591,963 A * 1/1997 Takeda et al. ........... 250/214.1
6,211,509 B1 * 4/2001 Inoue et al. .............. 250/208.1

FOREIGN PATENT DOCUMENTS

JP         03-174772 A   *   7/1991

* cited by examiner

*Primary Examiner*—Thanh X. Luu
(74) *Attorney, Agent, or Firm*—Sughrue Mion, PLLC

(57) ABSTRACT

A solid-state image pickup device is formed such that a charge transfer electrode, a field plate electrode, and a gate electrode are formed of an electrically conductive single-layer electrode material film, and the gaps between the electrodes are filled with an insulating film having a reflow property to be flattened, thereby reducing the height of the device and alleviating the irregularities of the surface. This makes it possible to reduce the thickness of the flattening film required for flattening the device upon formation of micro-lenses and provide an improved sensitivity to the solid-state image pickup device.

29 Claims, 11 Drawing Sheets

SOLID-STATE IMAGE PICKUP DEVICE HAVING IMPROVED FLATNESS AND METHOD FOR FABRICATING THE SAME

BACKGROUND OF THE INVENTION

1. Field of the Invention

The present invention relates to solid-state image pickup devices and methods for fabricating the device. More particularly, the present invention relates to a solid-state image pickup device with a charge transfer electrode formed by processing an electrically conductive single-layer electrode material film, the device being provided with improved flatness without forming a thick oxide film on a peripheral device isolating region, and to a method for fabricating the solid-state image pickup device.

2. Description of the Related Art

FIG. 1 is a cross-sectional view illustrating a prior-art solid-state image pickup device with a single-layer electrode structure, showing the solid-state image pickup region of the prior-art solid-state image pickup, and the peripheral circuit region constituted by a transistor portion and a P well contact (P contact) portion.

There are formed P+ regions 602 within the surface region of a P-type semiconductor substrate 601. The device comprises the isolated portions of a solid-state image pickup region and a peripheral circuit region that is constituted by a transistor portion and a P well contact portion. On top of the P+ regions 602, there are formed field oxide films 614, while gate insulating films 606 are formed on the surface of the P-type semiconductor substrate 601 in each device area. In this case, the device isolating region other than the solid-state image pickup region comprises the P+ regions 602 and the field oxide films 614. In the solid-state image pickup region, there is formed a P+ isolating region 603 adjacent to the P+ region 602, adjacent to which further formed is a charge transfer portion 605. On top of the gate insulating film 606, there is formed a charge transfer electrode 627. In addition, on the entire surface of the substrate 601, there is formed an interlayer insulating film 610 through which formed are contact holes 612 that reach the charge transfer electrode 627. A metal wiring 611 is formed through the contact holes 612.

The transistor portion of the peripheral circuit region has two devices and two gate insulating films 606. On top of one of the gate insulating films 606, there is formed a gate electrode 637. Below the other gate insulating film 606, formed are T regions 608 acting as the source and drain region of the transistor portion. On the other gate insulating film 606, the gate electrode 637 is formed so as to match between the N+regions 608. The contact holes 612 are formed through the interlayer insulating film 610 formed on the entire surface of the substrate 601 to reach the N+ regions 608 and the gate electrodes 637. The metal wiring 611 is formed through the contact hole 612.

In the P well contact portion of the peripheral circuit region, there is formed a P well contact portion 604 below the gate insulating film 606. The contact holes 612 are formed through the interlayer insulating film 610 formed on the entire surface of the substrate 601 to reach the P well contact portion 604. The metal wiring 611 is formed through the contact hole 612.

FIGS. 2A to 2H are cross-sectional views illustrating a method for fabricating the prior-art solid-state image pickup device with the single-layer electrode structure, showing the steps of the method in orderly sequence. Now, the method for fabricating the prior-art solid-state image pickup device having the single-layer electrode structure shown in FIG. 1 is explained below with reference to FIGS. 2A to 2H.

First, as shown in FIG. 2A, the P+ regions 602 are formed within the surface region of the P-type semiconductor substrate 601. A nitride film 616 is used as a mask and a pad oxide film 615 is scrolled to implant ions into the P+ regions 602.

Then, as shown in FIG. 2B, the surface of the substrate is subjected to a heat treatment, for example, in an atmosphere of steam at 980° C. to form the field oxide film 614. During this treatment, the region over which the nitride film 616 has been formed is not oxidized. For example, the field oxide film 614 is provided with a thickness of 800 to 1000 nm.

Then, as shown in FIG. 2C, an ion implantation such as of boron is performed to form the P+ isolating region 603 for isolating a device from another in the solid-state image pickup region, and the P well contact portion 604 formed in the peripheral circuit region.

Then, as shown in FIG. 2D, for example, a phosphorous ion implantation is performed to form the N-type region acting as the charge transfer portion 605.

Subsequently, as shown in FIG. 2E, the insulating film on the surface of the P-type semiconductor substrate other than the field oxide film 614 is removed to form again the gate insulating films 606. Then, a polysilicon layer acting as a charge transfer electrode material film is formed through the gate insulating film 606 and patterned to form the charge transfer electrode 627 and the gate electrodes 637 of the transistor in the peripheral circuit region. Then, as shown in FIG. 2F, for example, an arsenic ion implantation is performed to form the N+ region 608 serving as the SD (Source-Drain) of the transistor portion. Subsequently, as shown in FIG. 2G, the interlayer insulating film 610 is formed on the entire surface of the device. Then, as shown in FIG. 2H, the contact holes 612 are formed. Finally, as shown in FIG. 1, the metal wirings 611 are formed.

In the prior-art solid-state image pickup device with a single-layer electrode structure, the device isolating region other than the solid-state image pickup region was provided with thick field oxide films 614, thereby being made high above the substrate surface of the device as well as causing significant irregularities on the device surface.

In the solid-state image pickup device, an on-chip micro-lens is provided for each pixel in order to increase the power of focusing light onto the pixel. For this purpose, the device surface has to be made flat. Thus, significant heights of the device and irregularities on the surface would lead to a thicker flattening film. This would produce a defocusing effect of the light condensed by the micro-lens on the photoelectric conversion region formed in the substrate, thereby resulting in a drop in sensitivity. In particular, an increase in diagonally incident light would lead to a more significant drop in sensitivity.

SUMMARY OF THE INVENTION

It is therefore an object of the present invention to provide a solid-state image pickup device and a method for fabricating the device which is provided with improved flatness without forming a thick oxide film on the device isolating region around the device, which reduces the thickness of the flattening film required for flattening the device upon formation of the micro-lens, and which provides an improved sensitivity property especially upon incidence of light in diagonal directions onto the solid-state image pickup device.

A solid-state image pickup device according to the present invention comprises first and second insulating films formed on a surface of a semiconductor substrate; a solid-state image pickup region having, as a charge transfer electrode, an electrically conductive single-layer material film formed on the first insulating film; and a peripheral circuit region formed on the semiconductor substrate other than in the solid-state image pickup region. The solid-state image pickup device is characterized in that a device in the peripheral circuit region is isolated from another by means of an isolating electrode on the second insulating film, and the isolating electrode is formed of the single-layer conductive material film.

A gate electrode constituting a transistor in the peripheral circuit region is formed on the first insulating film in the peripheral circuit region, and the gate electrode is formed in the same step as that of the isolating electrode. The second insulating film may be thicker than the first insulating film. Alternatively, the second insulating film may be the same in thickness as the first insulating film. Furthermore, the first and second insulating films may be formed of the same material film.

As an applicable example, the aforementioned solid-state image pickup device can be configured such that a third insulating film is formed on the surface of the semiconductor substrate in addition to the first and second insulating films, a gate electrode constituting a transistor in the peripheral circuit region can be formed on the third insulating film in the peripheral circuit region, and the gate electrode can be formed in the same step as that of the isolating electrode. Here, the third insulating film can be thinner than the first insulating film, and the second insulating film can be thicker than the first insulating film. Alternatively, the third insulating film can be thinner than the first insulating film, and the second insulating film can be the same in thickness as the first insulating film.

The aforementioned solid-state image pickup device can also be configured such that a first diffusion layer for isolating a device from another is formed on the semiconductor substrate in the solid-state image pickup region, a second diffusion layer for isolating a device from another is formed on the semiconductor substrate below the isolating electrode in the peripheral circuit region, and the first and second diffusion layers are formed in the same step. Alternatively, the aforementioned solid-state image pickup device can also be configured such that a first diffusion layer for isolating a device from another is formed on the semiconductor substrate in the solid-state image pickup region; a second diffusion layer for isolating a device from another is formed on the semiconductor substrate below the isolating electrode in the peripheral circuit region; and the first and second diffusion layers are formed in different stepes. Particularly in the latter case, the second diffusion layer may preferably be higher in impurity concentration than the first diffusion layer. In addition, the second diffusion layer may be formed to be separated into at least two regions on the semiconductor substrate below the isolating electrode, and at least one of the regions may be connected to the isolating electrode.

Furthermore, it can be applicable in common to all the aforementioned solid-state image pickup devices that the electrically conductive single-layer material film is formed of a polysilicon film, or the electrically conductive single-layer material film is formed of a layered film of a polysilicon film and a metal silicide film formed on the polysilicon film, or the electrically conductive single-layer material film is formed of a metal film.

Furthermore, the aforementioned solid-state image pickup device can be configured such that a fourth insulating film is buried between electrodes formed of the electrically conductive single-layer material film, a surface of the semiconductor substrate comprising the electrodes and the fourth insulating film is made generally flat, and a constant voltage is applied to the isolating electrode.

Now, a method for fabricating a solid-state image pickup device is characterized by comprising the step of forming, in a solid-state image pickup region of a semiconductor substrate, a first diffusion layer for isolating a device from another in the solid-state image pickup region and in a peripheral circuit region other than the solid-state image pickup region of the semiconductor substrate, a second diffusion layer for isolating a device from another in the peripheral circuit region, respectively. The method also comprises the step of forming, on a surface of the semiconductor substrate of the solid-state image pickup region, a first insulating film and on a surface of the semiconductor substrate of the peripheral circuit region, at least a second insulating film, respectively. The method further comprises the steps of depositing an electrically conductive electrode material film on a surface of the semiconductor substrate including the first and second insulating films, and forming a charge transfer electrode on the first insulating film of the solid-state image pickup region by patterning the electrically conductive electrode material film and an isolating electrode on the second insulating film of the peripheral circuit region, respectively.

In the step of forming the first and second diffusion layers, the first and second diffusion layers may be formed at the same time. Alternatively, the first and second diffusion layers may be formed independent of each other. Particularly in the latter case, the second diffusion layer may preferably be higher in impurity concentration than the first diffusion layer.

Furthermore, the aforementioned method for fabricating a solid-state image pickup device can be adapted such that in the step of forming the first and second insulating films, the first and second insulating films are formed at the same time. Alternatively, it can be adopted such that the first and second insulating films are formed independent of each other, and the second insulating film is thicker than the first insulating film.

Furthermore, as an applicable example, the aforementioned method for fabricating a solid-state image pickup device can be adapted such that the step of forming, on the surface of the semiconductor substrate of the solid-state image pickup region, the first insulating film and on the surface of the semiconductor substrate of the peripheral circuit region, at least the second insulating film, respectively, comprises the steps of forming, on the surface of the semiconductor substrate of the solid-state image pickup region, the first insulating film and on the surface of the semiconductor substrate of the peripheral circuit region, the first and second insulating films, respectively, and in the step of forming the charge transfer electrode on the first insulating film of the solid-state image pickup region by patterning the electrically conductive electrode material film and the isolating electrode on the second insulating film of the peripheral circuit region, respectively, a gate electrode formed of the electrically conductive electrode material film of the peripheral circuit region is formed at the same time on the first insulating film of the peripheral circuit region. Alternatively, the method for fabricating a solid-state image pickup device can be adapted such that the step of forming, on the surface of the semiconductor substrate of the solid-state image pickup region, the first insulating film and on the surface of the semiconductor substrate of the peripheral circuit region, at least the second insulating film, respectively, comprises the step of forming, on the surface of the semiconductor substrate of the solid-state image pickup region, the first insulating film and on the surface of the semiconductor substrate of the peripheral circuit region, the second insulating film and a third insulating film, respectively, and in the step of forming the charge transfer electrode on the first insulating film of the solid-state image pickup region by patterning the electrically conductive electrode material film and the isolating electrode on the second insulating film of the peripheral circuit region, respectively, a gate electrode formed of the electrically conductive electrode material film of the peripheral circuit region is formed at the same time on the third insulating film of the peripheral circuit region. Particularly in the latter case, in the step of forming, on the surface of the semiconductor substrate of the solid-state image pickup region, the first insulating film and on the surface of the semiconductor substrate of the peripheral circuit region, the second and third insulating films, respectively, the third insulating film is formed to be thinner than the first insulating film.

The aforementioned method for fabricating a solid-state image pickup device according to the present invention can be implemented in a manner such that the step of patterning the electrically conductive electrode material film is followed by the step of burying a fourth insulating film between electrodes formed of the electrically conductive electrode material film including the charge transfer electrode and the isolating electrode. Moreover, the step of burying the fourth insulating film between electrodes formed of the electrically conductive electrode material film may be performed by depositing an insulating film made flowing by heat on the surface of the semiconductor substrate including the electrodes to be thicker than the electrodes, then flattening the surface of the insulating film through heat treatment on the insulating film, and etching uniformly the insulating film from a surface thereof to bury the insulating film between the electrodes.

DETAILED DESCRIPTION OF THE PREFERRED EMBODIMENT

Now, the solid-state image pickup device and the method for fabricating the device according to the embodiments of the present invention will be explained below in detail with reference to the accompanying drawings.

Figure 1:
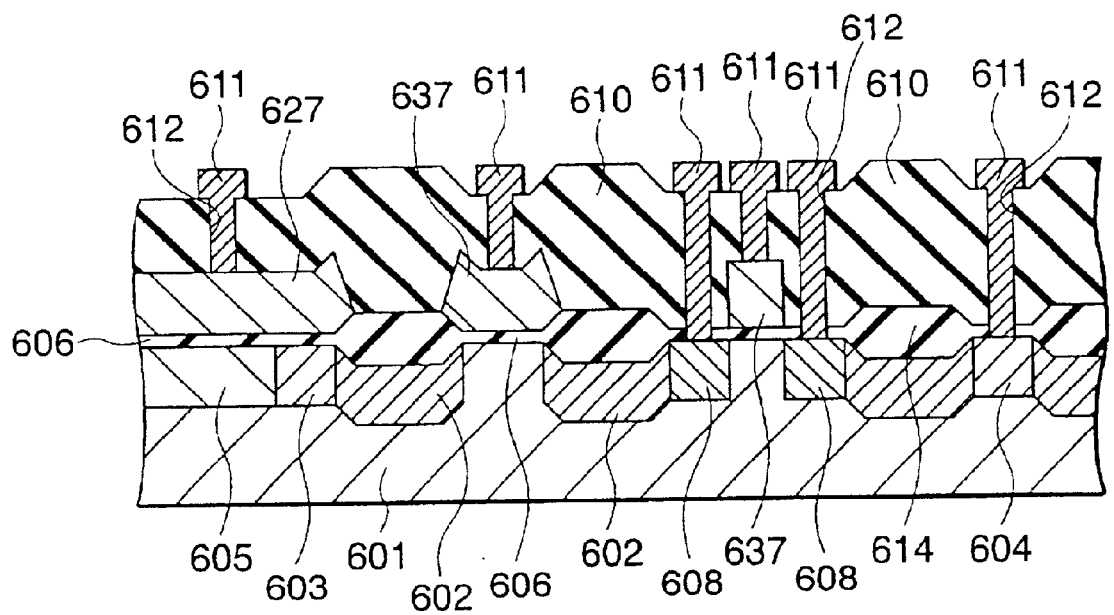
FIG. 1 is a cross-sectional view illustrating a prior art solid-state image pickup device with a single-layer electrode structure.
Figure 2A:
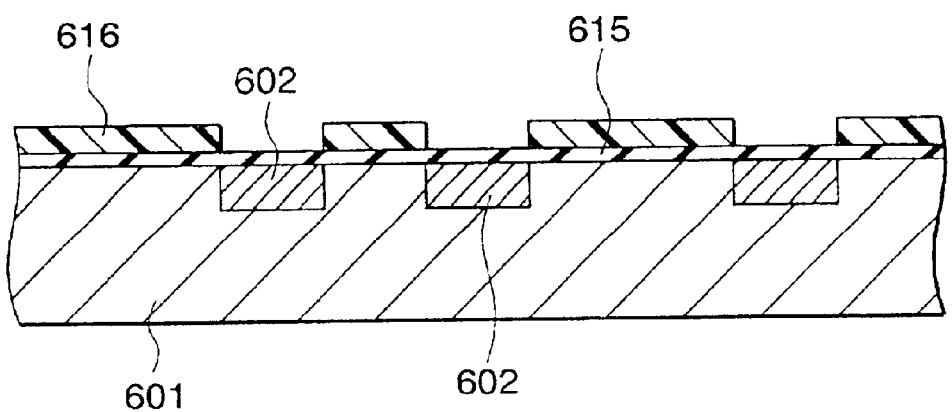
FIGS. 2A to 2H are cross-sectional views illustrating a method for fabricating the prior art solid-state image pickup device with the single-layer electrode structure, showing the steps of the method in orderly sequence.
Figure 2B:
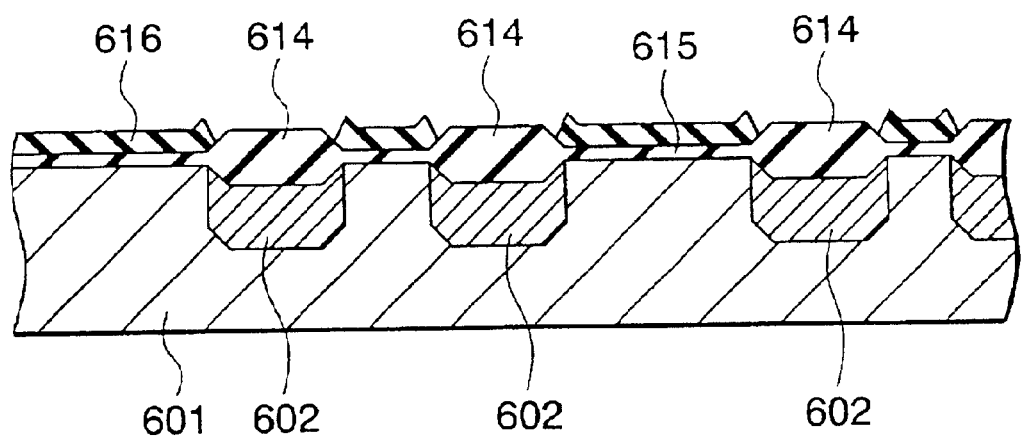
Figure 2C:
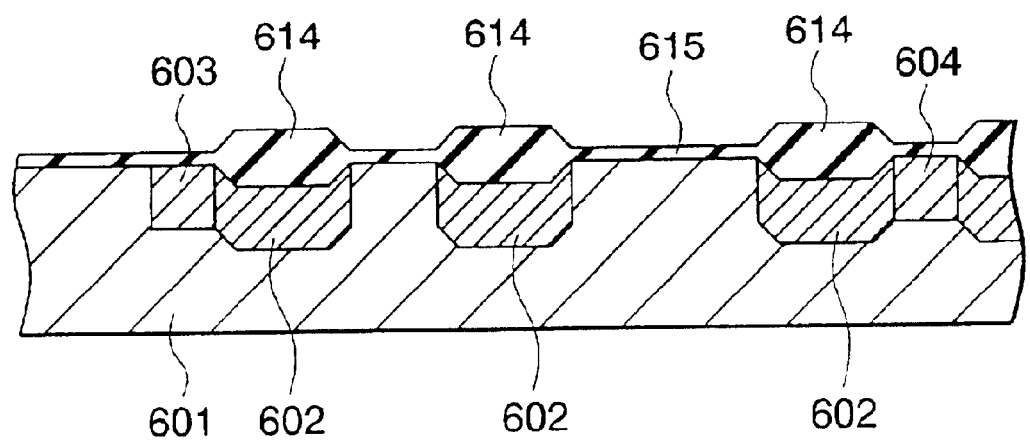
Figure 2D:
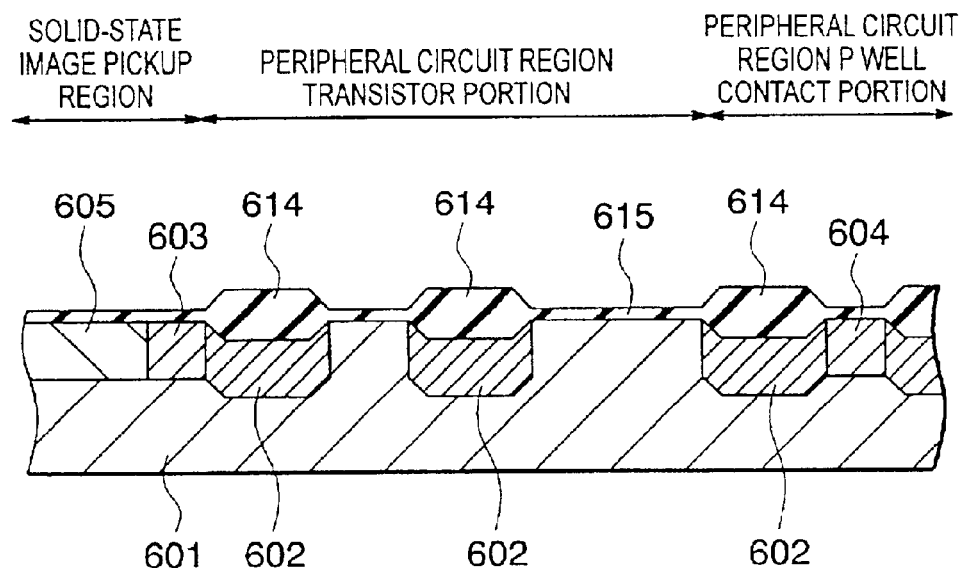
Figure 2E:
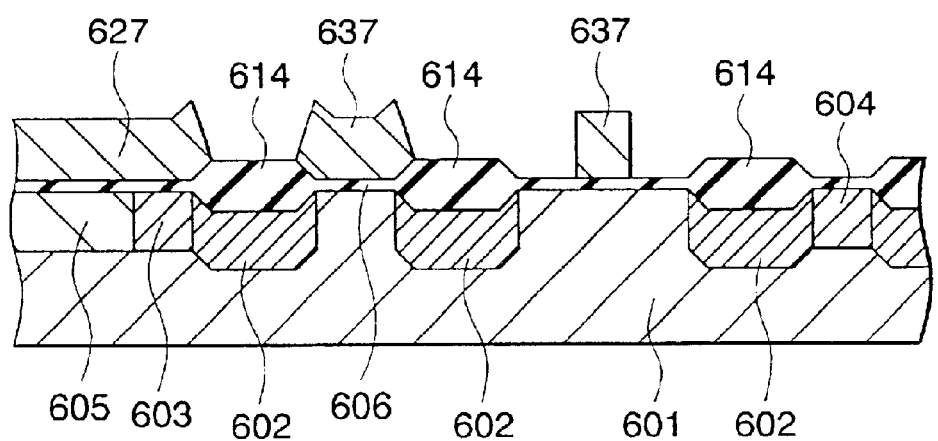
Figure 2F:
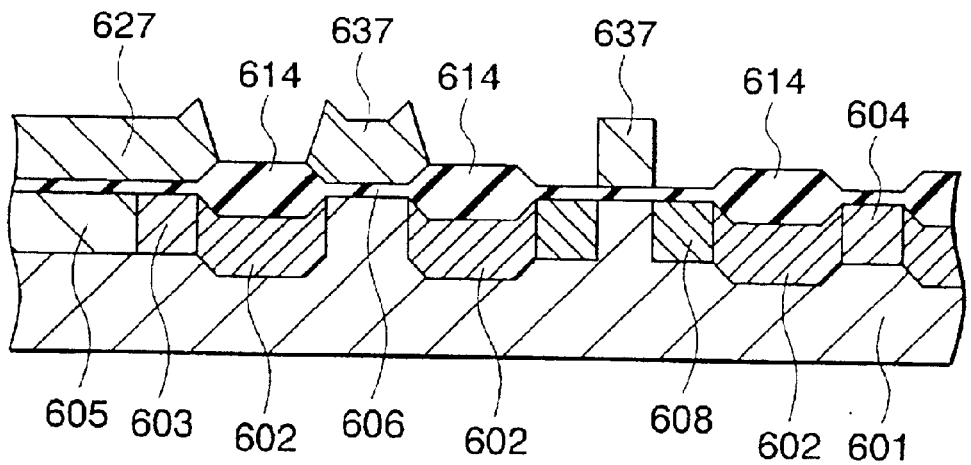
Figure 2G:
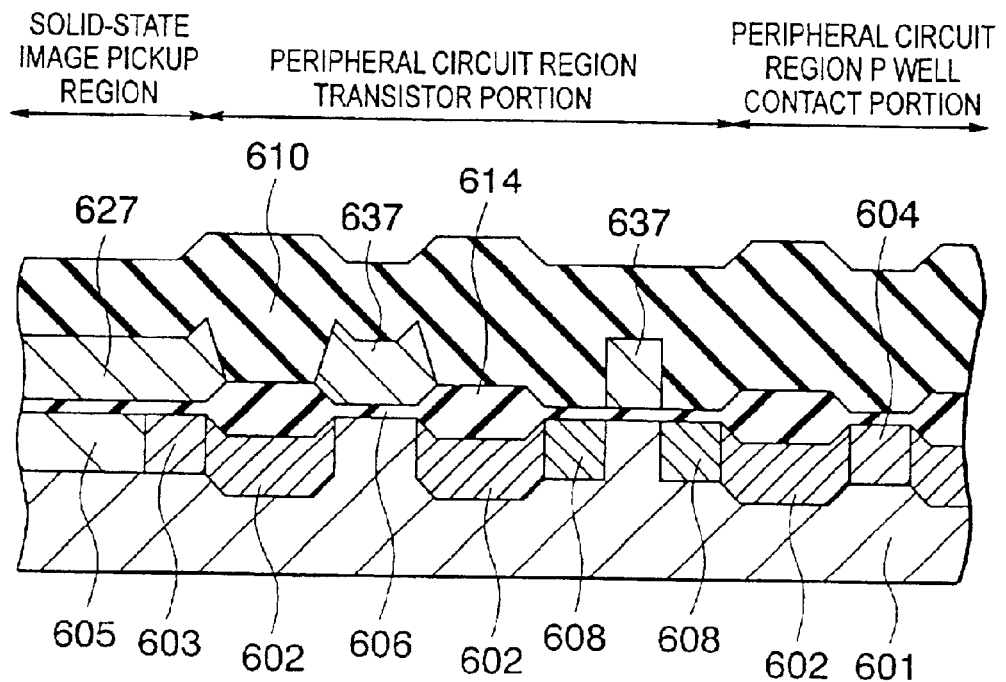
Figure 2H:
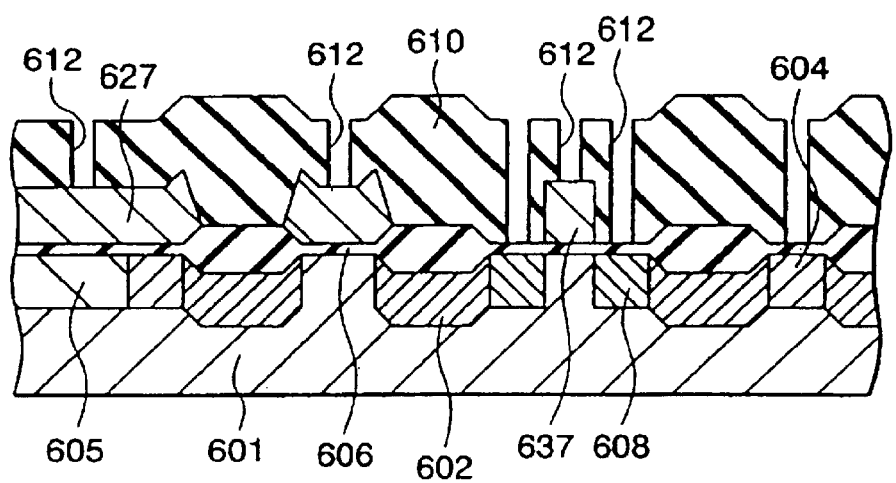
Figure 3:
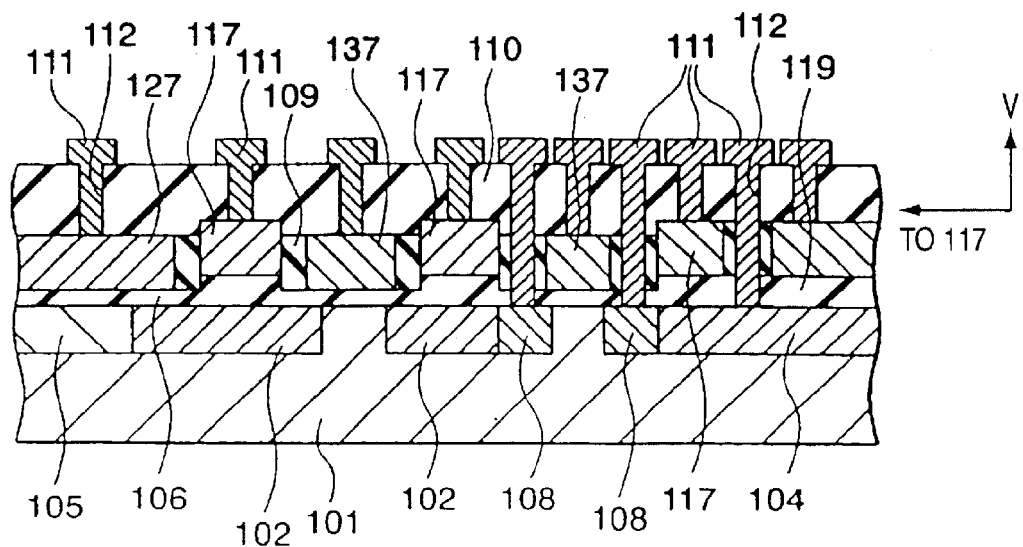
FIG. 3 is a cross-sectional view illustrating a solid-state image pickup device according to a first embodiment of the present invention.

FIG. 3 is a cross-sectional view illustrating a solid-state image pickup device according to a first embodiment of the present invention. Shown in the figure are a solid-state image pickup region of the solid-state image pickup device, comprising a charge transfer electrode formed of an electrically conductive single-layer electrode material film, and a peripheral circuit constituted by a transistor portion and a P well contact (P contact) portion.

There are formed $P^+$ regions 102 and a P well contact portion 104 within the surface region of a P-type semiconductor substrate 101. The device comprises isolated portions of a solid-state image pickup region and a peripheral circuit region constituted by a transistor portion and a P well contact portion. On the surface of the P-type semiconductor substrate 101 in each device area, there is formed a thick gate insulating film 106 on the $P^+$ regions 102 and the P well contact portion 104. On top of a thick gate oxide film 119, there is formed a field plate electrode 117. In this case, the device isolating region other than the solid-state image pickup region comprises the $P^+$ regions 102 and the field plate electrode 117 formed via the thick gate oxide film 119. In the solid-state image pickup region, there is formed a charge transfer portion 105 adjacent to the $P^+$ region 102. On top of the gate insulating film 106, there is formed a charge transfer electrode 127. In addition, on the entire surface of the substrate 101, there is formed an interlayer insulating film 110 through which formed are contact holes 112 that reach the charge transfer electrode 127. A metal wiring 111 is formed through the contact hole 112.

The transistor portion of the peripheral circuit region has two devices and two gate insulating films 106. On top of one of the gate insulating films 106, there is formed a gate electrode 137. Below the other gate insulating film 106, formed are $N^+$ regions 108 acting as the source and drain region of the transistor region. On the other gate insulating film 106, the gate electrode 137 is formed so as to match between the $N^+$ regions 108. The contact holes 112 are formed through the interlayer insulating film 110 formed on the entire surface of the substrate 101 to reach the $N^+$ regions 108 and the gate electrodes 137. The metal wiring 111 is formed through the contact hole 112.

In the P well contact portion of the peripheral circuit region, the contact holes 112 are formed through the interlayer insulating film 110 formed on the entire surface of the substrate 101 to reach the P well contact portion 104. The metal wiring 111 is formed through the contact hole 112. Furthermore, the contact holes 112 that reach the field plate electrode 117 are formed through the interlayer insulating film 110. The metal wiring 111 is formed through the contact hole 112.

The ground voltage or a negative constant voltage is applied to the field plate electrode 117 so as to make the P+regions 102 filled with holes. FIGS. 4A to 4L are cross-sectional views illustrating a method for fabricating a solid-state image pickup device according to the first embodiment of the present invention, showing the steps of the method in orderly sequence. Now, the method for fabricating the solid-state image pickup device according to the present invention shown in FIG. 3 is explained below with reference to FIGS. 4A to 4L.

Figure 4A:
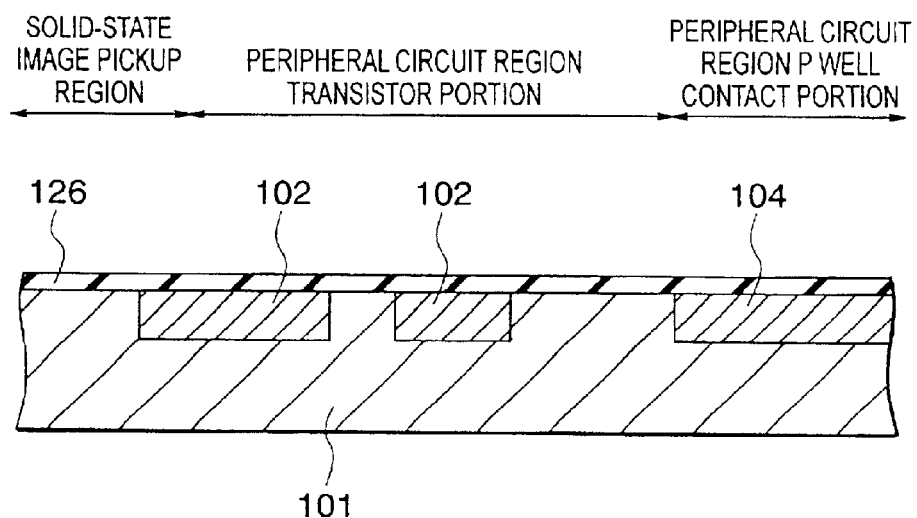
FIGS. 4A to 4L are cross-sectional views illustrating a method for fabricating a solid-state image pickup device according to the first embodiment of the present invention, showing the steps of the method in orderly sequence.

First, as shown in FIG. 4A, the P+ regions 102 are formed via an oxide film 126 formed on the surface of the P-type semiconductor substrate 101 within the surface region of the P-type semiconductor substrate 101. Here, the P+ regions 102 are formed such as by a boronic ion implantation in a region across the solid-state image pickup region and the transistor portion of the peripheral circuit region and in the transistor portion of the peripheral circuit region. At the same time, the P well contact portion 104 is also formed in the P well contact portion of the peripheral circuit region.

Figure 4B:
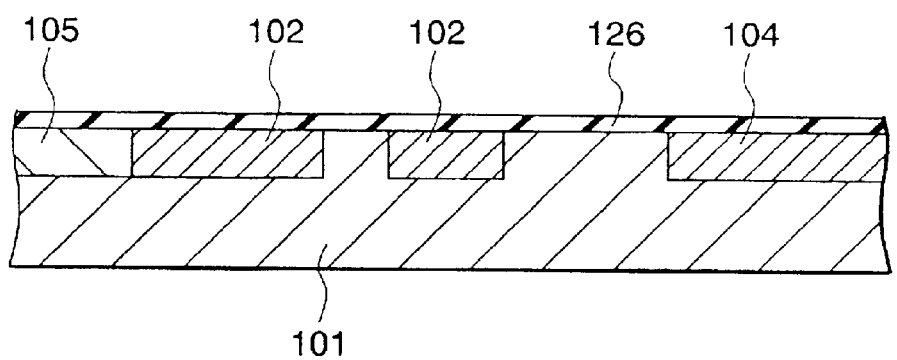

Then, as shown in FIG. 4B, an N-type region acting as the charge transfer portion 105 is formed such as by a phosphorous ion implantation.

Figure 4C:
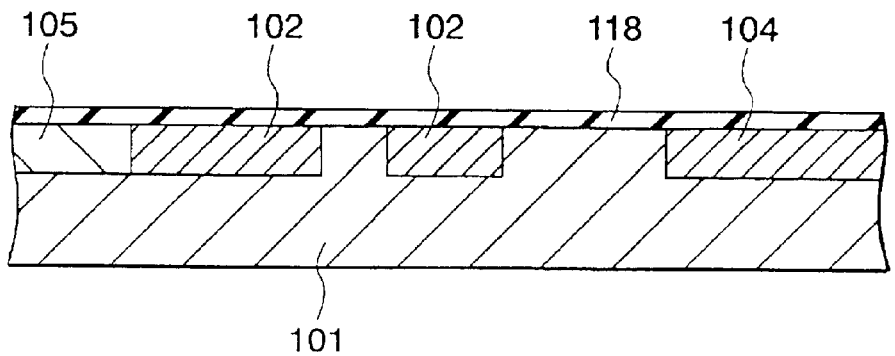

Then, as shown in FIG. 4C, after the oxide film 126 has been removed, the surface of the substrate is subjected, for example, to thermal oxidation to newly form an oxide film 118.

Figure 4D:
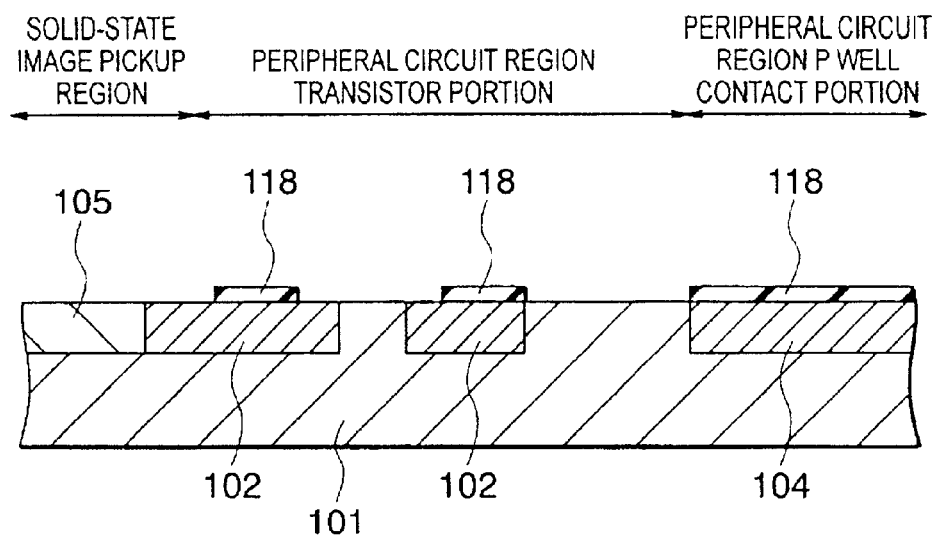

Then, as shown in FIG. 4D, while the oxide film 118 is allowed to remain only in a region corresponding to the device isolating region other than in the solid-state image pickup region, the oxide film 118 in other regions is removed by etching.

Figure 4E:
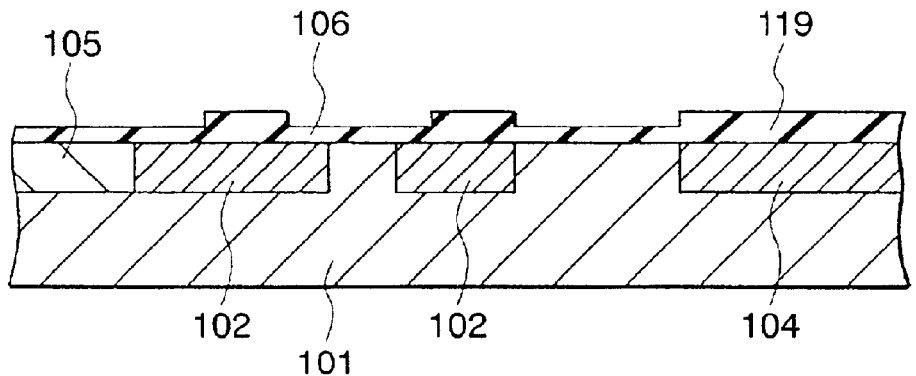

Then, as shown in FIG. 4E, for example, the surface of the substrate is subjected again to thermal oxidation to form the gate insulating film 106 and the thick gate oxide film 119. In this case, for example, the gate insulating film 106 is formed in a thickness of 100 nm, and the thick gate oxide film 119 is formed in a thickness of 200 nm.

Figure 4F:
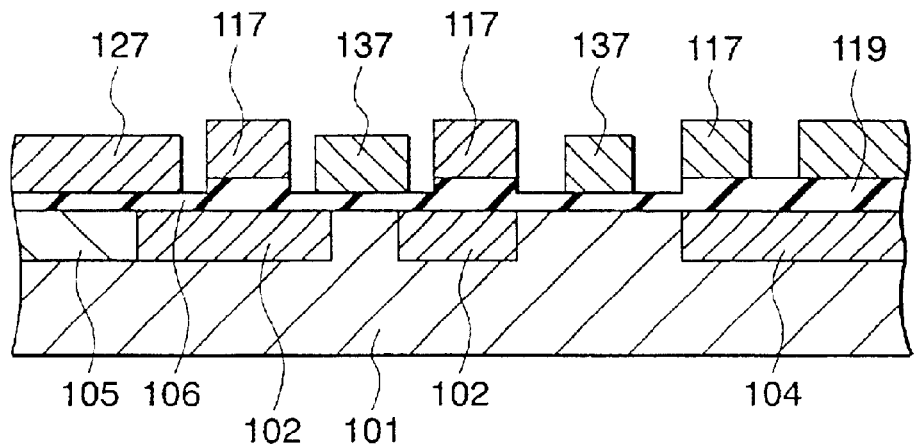

Then, as shown in FIG. 4F, a polysilicon layer serving as a charge transfer electrode material film is formed on the gate insulating film 106 and the thick gate oxide film 119. Thus, simultaneously formed are the charge transfer electrode 127, the gate electrodes 137 for the transistor of the peripheral circuit, and the field plate electrodes 117.

Figure 4G:
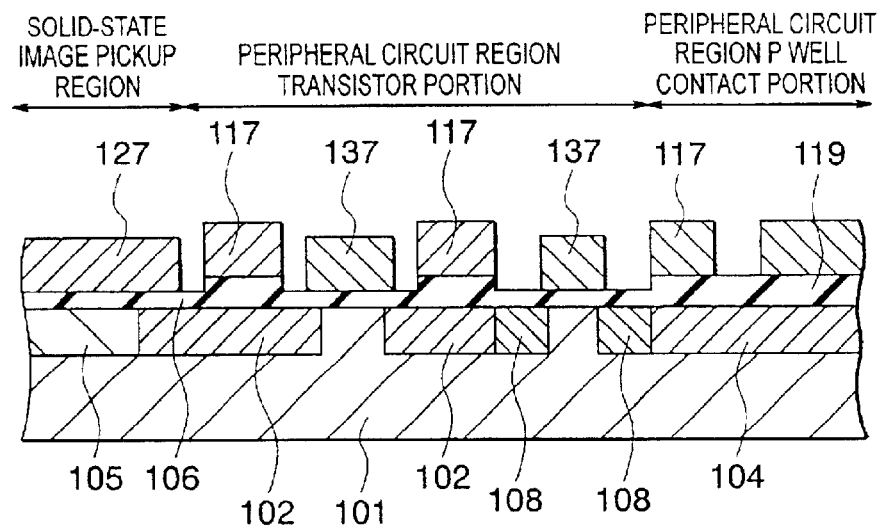

Then, as shown in FIG. 4G, for example, an arsenic ion implantation is performed to form the N+ regions 108 acting as the SD (Source-Drain) of the transistor region.

Figure 4H:
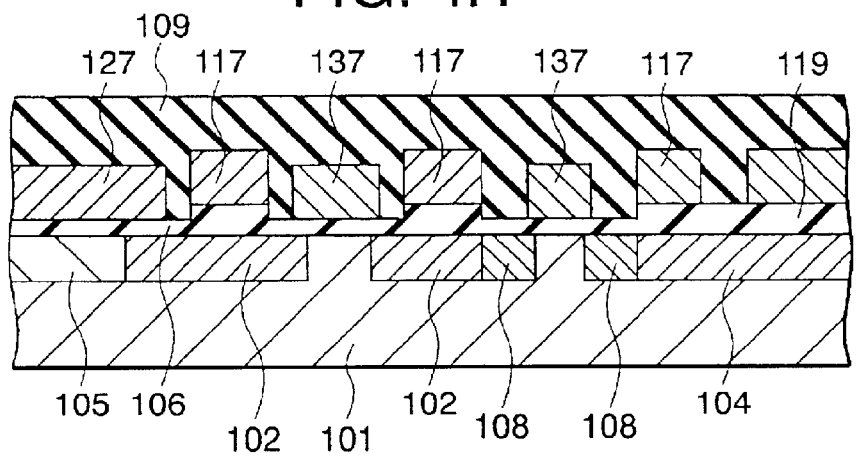

Then, as shown in FIG. 4H, an insulating film having a thermal reflow property such as a BPSG (Boro-Phospho-Silicate-Glass) film 109 is deposited on the entire surface of the device. Thereafter, the BPSG film 109 is subjected to a heat treatment in an nitrogen atmosphere at temperatures ranging from about 850° C. to 950° C., allowing the BPSG film 109 to reflow to flatten the device surface.

Figure 4I:
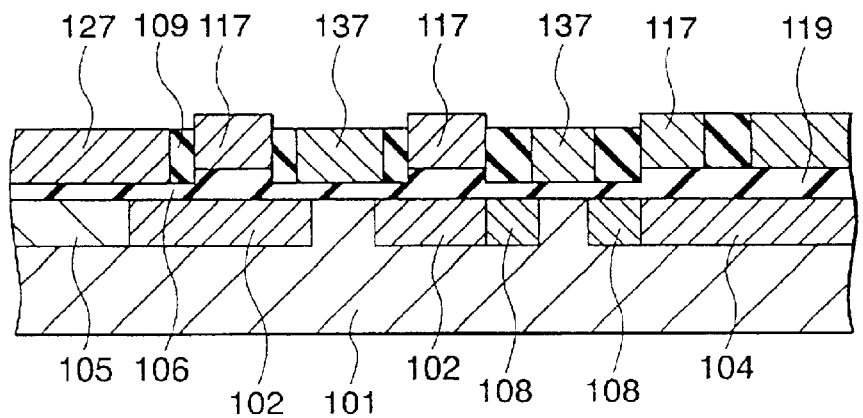

Then, as shown in FIG. 4I, the BPSG film 109 is etched until the surfaces of the charge transfer electrode 127, the gate electrode 137, and the field plate electrode 117 are exposed, thereby burying the BPSG film 109 only into the gap portions between electrodes.

Figure 4J:
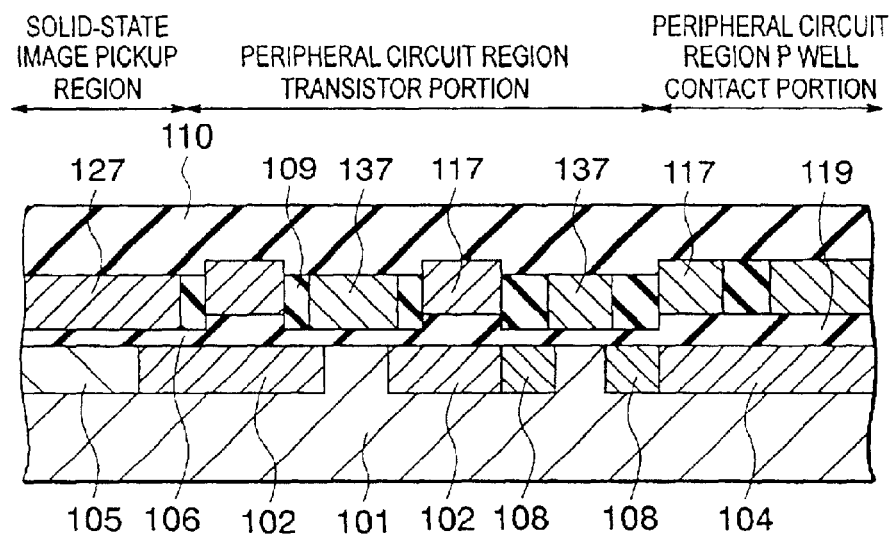

Then, as shown in FIG. 4J, the interlayer insulating film 110 is formed on the entire surface of the device.

Figure 4K:
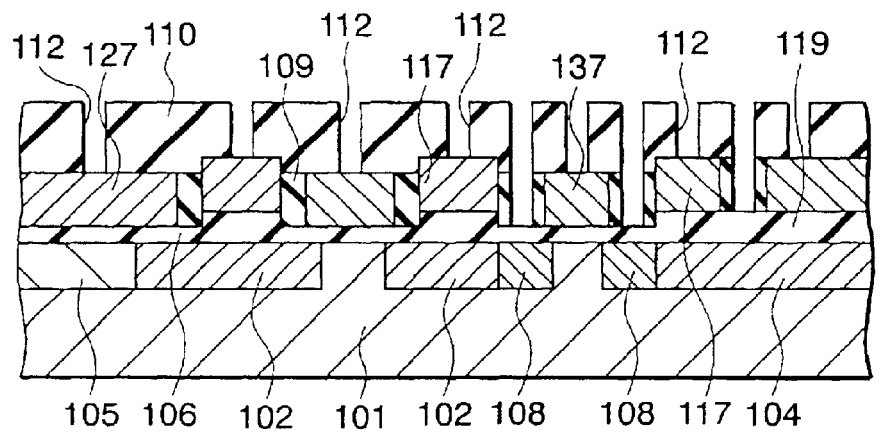

Then, as shown in FIG. 4K, the contact holes 112 are formed.

Figure 4L:
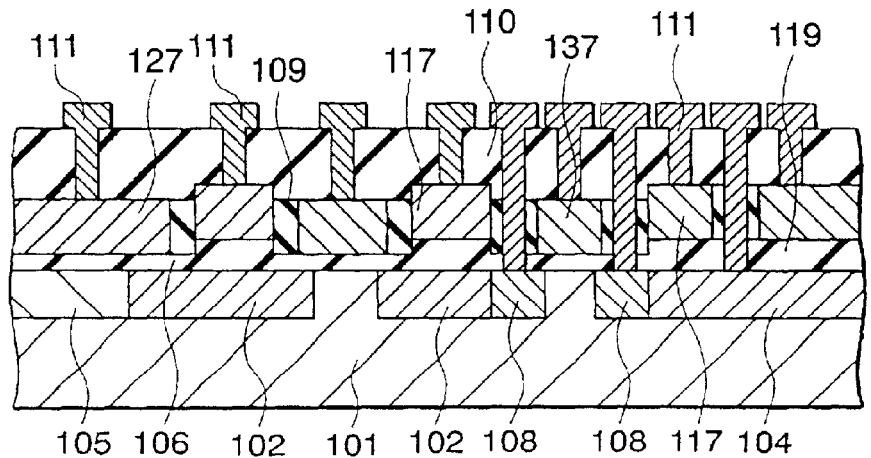

Finally, as shown in FIG. 4L, the metal wiring 111 is formed.

In the first embodiment of the present invention, the device isolating region around the device is made up of a diffusion layer formed within the substrate surface region and a plate electrode formed of the same material as the electrically conductive single-layer electrode material film that is formed on the diffusion layer via the gate insulating film. In addition, the gaps between the electrodes are filled with an insulating film having a reflow property to be flattened, thereby reducing the height of the device and alleviating the irregularities of the surface. This makes it possible to reduce the thickness of the flattening film required for flattening the device upon formation of microlenses and provide an improved sensitivity for the solid-state image pickup device.

Figure 5:
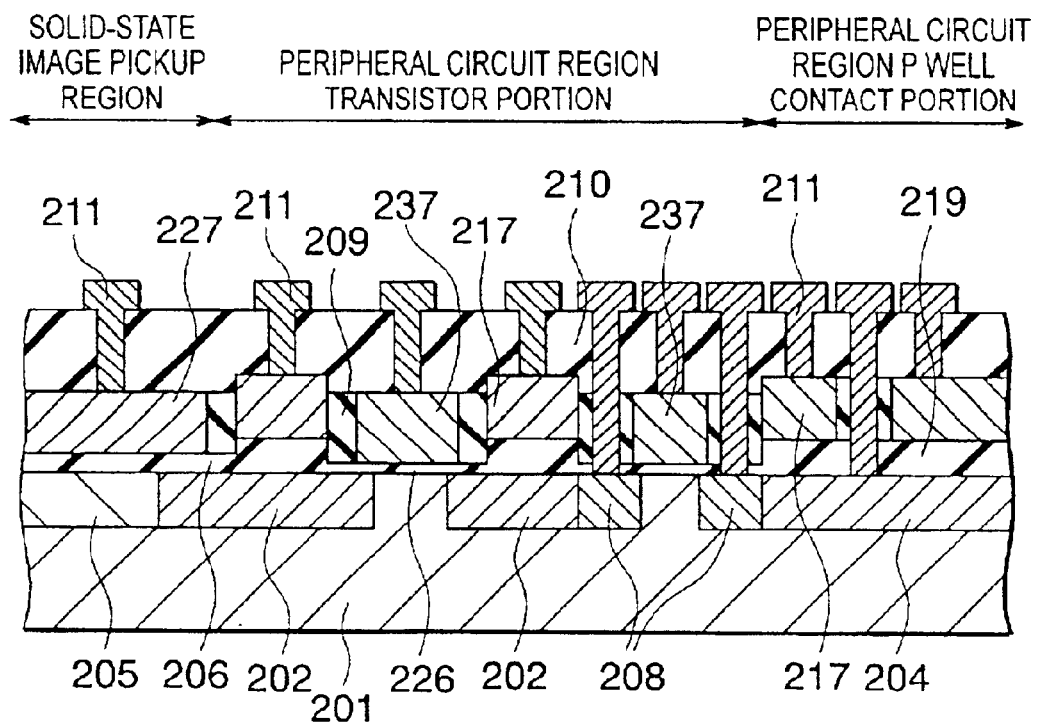
FIG. 5 is a cross-sectional view illustrating a solid-state image pickup device according to a second embodiment of the present invention.

FIG. 5 is a cross-sectional view illustrating a solid-state image pickup device according to a second embodiment of the present invention. Now, the second embodiment of the present invention will be explained below with reference to FIG. 5.

This embodiment is different from the first embodiment in that a gate insulating film 226 of the peripheral circuit transistor is thinner than a gate insulating film 206 of the solid-state image pickup device in the image pickup region to provide a greater drive capability for the peripheral circuit transistor, and a gate insulating film 219 thicker than the gate insulating film 206 of the solid-state image pickup device is formed in the device isolating portion of the peripheral circuit region. Other components are configured in the same manner as in the first embodiment and not repeatedly explained.

Figure 6:
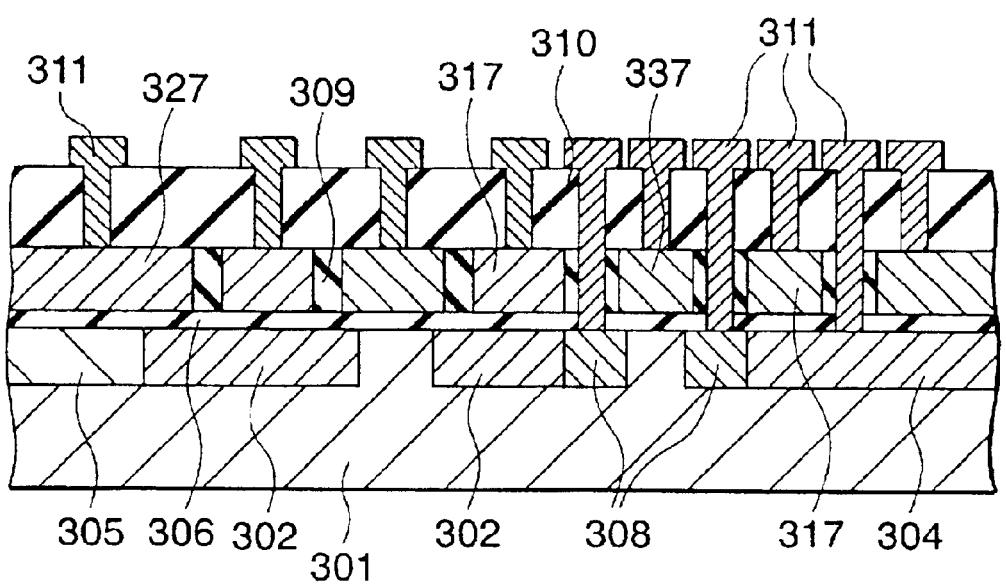
FIG. 6 is a cross-sectional view illustrating a solid-state image pickup device according to a third embodiment of the present invention.

FIG. 6 is a cross-sectional view illustrating a solid-state image pickup device according to a third embodiment of the present invention. Now, the third embodiment of the present invention will be explained below with reference to FIG. 6. FIG. 6 shows the solid-state image pickup region of the solid-state image pickup device, in which the charge transfer electrodes are formed of electrically conductive single-layer electrode material film, and the transistor portion and the P well contact (P contact) portion which constitute the peripheral circuit.

This embodiment is different from the first embodiment in that the gate insulating film formed below a field plate electrode 317 is commonly employed as a gate insulating film 306 to be used in the solid-state image pickup region.

The employment of the structure according to this embodiment obviates the step of the fabrication method according to the first embodiment in which formed are the gate insulating films different in thickness from each other, thereby simplifying the process.

Figure 7:
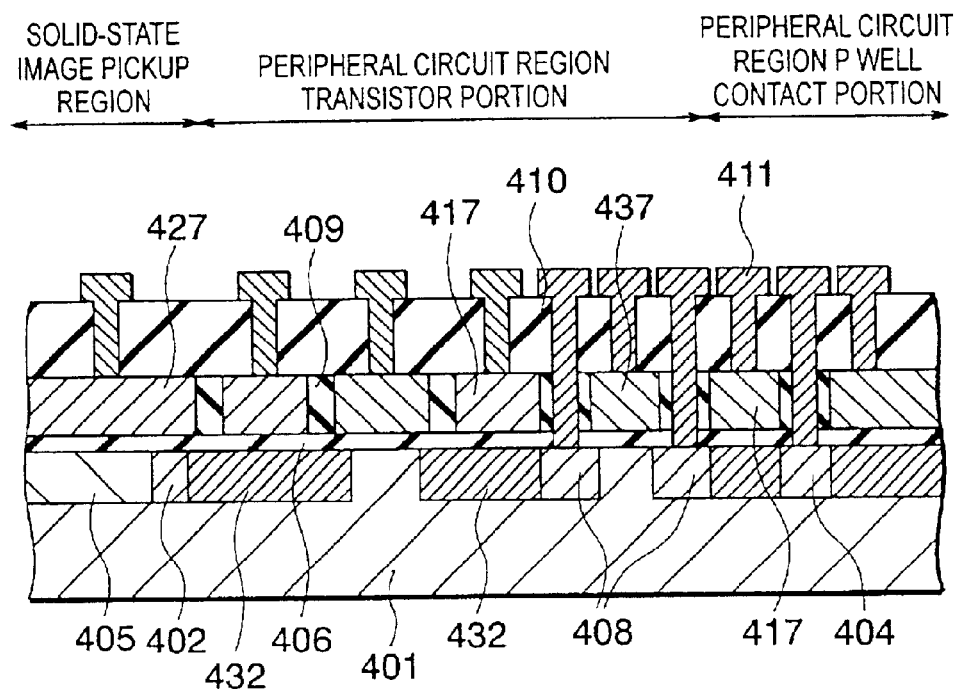
FIG. 7 is a cross-sectional view illustrating a solid-state image pickup device according to a fourth embodiment of the present invention.

FIG. 7 is a cross-sectional view illustrating a solid-state image pickup device according to a fourth embodiment of the present invention. Now, the fourth embodiment of the present invention will be explained below with reference to FIG. 7. FIG. 7 shows the solid-state image pickup region of the solid-state image pickup device, in which the charge transfer electrodes are formed of electrically conductive single-layer electrode material film, and the transistor portion and the P well contact (P contact) portion which constitute the peripheral circuit.

In this embodiment, a P+ region 432 below a field plate electrode 417 is formed in a different step from that of a P+ region 402 for isolating a device from another in the solid-state image pickup region, with the P+ regions 432 and the P+ region 402 having different concentrations. Furthermore, the impurity concentration of the P+ region 432 below the field plate electrode 417 is higher than those of the P+ region 402 and a P well contact portion 404. It is preferable that the device isolating region in the solid-state image pickup region is prevented from spreading laterally, and is provided with the widest possible effective device area and the lowest possible impurity concentration. This embodiment makes it possible to set the device isolating portion in the solid-state image pickup region and the device isolating portion other than in the solid-state image pickup region to an optimum impurity concentration, respectively. This provides for an advantage of making full use of the device properties while ensuring the isolating capability.

Figure 8:
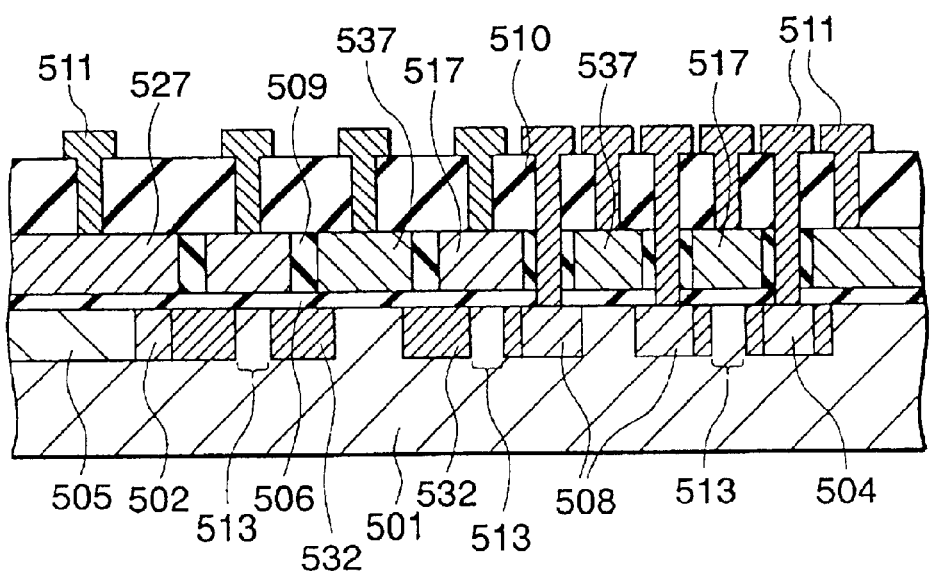
FIG. 8 is a cross-sectional view illustrating a solid-state image pickup device according to a fifth embodiment of the present invention.

FIG. 8 is a cross-sectional view illustrating a solid-state image pickup device according to a fifth embodiment of the present invention. Now, the fifth embodiment of the present invention will be explained below with reference to FIG. 8. FIG. 8 shows the solid-state image pickup region of the solid-state image pickup device, in which the charge transfer electrodes are formed of electrically conductive single-layer electrode material film, and the transistor portion and the P well contact (P contact) portion which constitute the peripheral circuit.

This embodiment is different from the fourth embodiment in that space regions 513 in which no P+ regions exist are formed below field plate electrodes 517 to reduce the parasitic capacitance between the space region 513 and the field plate electrode 517 running above the space regions 513.

Upon application of a constant voltage to the field plate electrodes 517, this embodiment allows P+ regions 532 adjacent to each other to be electrically coupled to each other, showing the same electrical properties as those provided when P+ regions are not partially eliminated.

As in the foregoing, the present invention has been described with reference to the first to fifth embodiments, however, the present invention is not limited these embodiments. For example, the second and fourth embodiments can be combined as follows. That is, the gate insulating film of the peripheral circuit transistor can be made thinner than that of the solid-state image pickup device in the image pickup region to provide an increased drive capability for the peripheral circuit transistor, the P+ region for isolating a device from another in the peripheral circuit region can be made higher in impurity concentration than the P+ region of the solid-state image pickup region to optimize the impurity concentration of the P+ region in each region. Furthermore, the first to fifth embodiments combined with each other can also be applicable.

Incidentally, the charge transfer electrode material film of the solid-state image pickup device according to the present invention can be optionally selected from the group consisting of polysilicon, a layered film of polysilicon and metal silicide, and a metal film so long as the film is formed of one layer of material that is electrically connected.

As described above, the present invention can provide a solid-state image pickup device having a single-layer electrode structure in which the device isolating region around the device comprises a diffusion layer formed within the substrate surface region and a plate electrode formed of the same material as the electrically conductive single-layer electrode material film formed via the gate insulating film on the diffusion layer. Furthermore, the gaps between the electrodes are filled with an insulating film having a reflow property to be flattened, thereby reducing the height of the device. Thus, the irregularities on the surface of the device are alleviated, thereby making it possible to reduce the thickness of the flattening film required for flattening the device upon formation of micro-lenses and provide an improved sensitivity to the solid-state image pickup device.

What is claimed is:

1. A solid-state image pickup device comprising:

first and second insulating films formed on a surface of a semiconductor substrate, said second insulating film being formed thicker than said first insulating film;

a solid-state image pickup region having only said first insulating film provided thereon and having, as a charge transfer electrode, an electrically conductive material film formed on said first insulating film, and a peripheral circuit region formed on said semiconductor substrate other than in said solid-state image pickup region, said peripheral circuit region having said first and second insulating films provided thereon, and further, an isolating electrode, formed of said conductive material film and on said second insulating film, for isolation of devices included in said peripheral circuit region.

2. The solid-state image pickup device according to claim 1, wherein a gate electrode constituting a transistor in said peripheral circuit region is formed on the first insulating film in said peripheral circuit region, and said gate electrode is formed in the same step as that of said isolating electrode.

3. The solid-state image pickup device according to claim 1, wherein said first and second insulating films are formed of the same material film.

4. The solid-state image pickup device according to claim 1, wherein a third insulating film is formed thinner than said first insulating film on the surface of said semiconductor substrate in said peripheral circuit region in addition to said first and second insulating films, and wherein a gate electrode constituting a transistor in said peripheral circuit region is formed on the third insulating film in said peripheral circuit region, and said gate electrode is formed in the same step as that of said isolating electrode.

5. The solid-state image pickup device according to claim 4, wherein a first diffusion layer for device isolation is formed on the semiconductor substrate in said solid-state image pickup region, a second diffusion layer for device isolation is formed on the semiconductor substrate below the isolating electrode in said peripheral circuit region, and said first and second diffusion layers are formed in the same step.

6. The solid-state image pickup device according to claim 4, wherein a first diffusion layer for isolating a device from another is formed on the semiconductor substrate in said solid-state image pickup region, a second diffusion layer for isolating a device from another is formed on the semiconductor substrate below the isolating electrode in said peripheral circuit region, and said first and second diffusion layers are formed in different steps.

7. The solid-state image pickup device according to claim 6, wherein said second diffusion layer is higher in impurity concentration than said first diffusion layer.

8. The solid-state image pickup device according to claim 7, wherein said second diffusion layer is formed to be separated into at least two regions on the semiconductor substrate below said isolating electrode, and at least one of the at least two regions is connected to said isolating electrode.

9. The solid-state image pickup device according to claim 6, wherein said second diffusion layer is formed to be separated into at least two regions on the semiconductor substrate below said isolating electrode, and at least one of the at least two regions is connected to said isolating electrode.

10. The solid-state image pickup device according to claim 4, wherein said electrically conductive single-layer material film is formed of a polysilicon film.

11. The solid-state image pickup device according to claim 4, wherein
said electrically conductive material film is formed of a layered film of a polysilicon film and a metal silicide film formed on the polysilicon film.

12. The solid-state image pickup device according to claim 4, wherein
said electrically conductive material film is formed of a metal film.

13. The solid-state image pickup device according to claim 4, wherein
a fourth insulating film is buried between electrodes formed of said electrically conductive material film, and
a surface of the semiconductor substrate comprising said electrodes and said fourth insulating film is made generally flat.

14. The solid-state image pickup device according to claim 4, wherein a constant voltage is applied to said isolating electrode.

15. The solid-state image pickup device according to claim 1, wherein a first diffusion layer for device isolation is formed on the semiconductor substrate in said solid-state image pickup region,
a second diffusion layer for device isolation is formed on the semiconductor substrate below the isolating electrode in said peripheral circuit region, and
said first and second diffusion layers are formed in the same step.

16. The solid-state image pickup device according to claim 1, wherein
a first diffusion layer for isolating a device from another is formed on the semiconductor substrate in said solid-state image pickup region,
a second diffusion layer for isolating a device from another is formed on the semiconductor substrate below the isolating electrode in said peripheral circuit region, and
said first and second diffusion layers are formed in different steps.

17. The solid-state image pickup device according to claim 16, wherein
said second diffusion layer is higher in impurity concentration than said first diffusion layer.

18. The solid-state image pickup device according to claim 17, wherein
said second diffusion layer is formed to be separated into at least two regions on the semiconductor substrate below said isolating electrode, and
at least one of the at least two regions is connected to said isolating electrode.

19. The solid-state image pickup device according to claim 16, wherein
said second diffusion layer is formed to be separated into at least two regions on the semiconductor substrate below said isolating electrode, and
at least one of the at least two regions is connected to said isolating electrode.

20. The solid-state image pickup device according to claim 1, wherein said electrically conductive single-layer material film is formed of a polysilicon film.

21. The solid-state image pickup device according to claim 1, wherein
said electrically conductive material him is formed of a layered film of a polysilicon film and a metal silicide film formed on the polysilicon film.

22. The solid-state image pickup device according to claim 3, wherein
said electrically conductive material film is formed of a metal film.

23. The solid-state image pickup device according to claim 1, wherein
a fourth insulating film is buried between electrodes formed of said electrically conductive material film, and
a surface of the semiconductor substrate comprising said electrodes and said fourth insulating film is made generally flat.

24. The solid-state image pickup device according to claim 1, wherein a constant voltage is applied to said isolating electrode.

25. A method for fabricating a solid-state image pickup device, comprising the steps of:
forming, in a solid-state image pickup region of a semiconductor substrate, a first diffusion layer for isolating a device from another in said solid-state image pickup region and in a peripheral circuit region other than the solid-state image pickup region of said semiconductor substrate, a second diffusion layer for isolating a device from another in said peripheral circuit region, respectively,
forming, on a surface of the semiconductor substrate of said solid-state image pickup region, a first insulating film and on a surface of the semiconductor substrate of said peripheral circuit region, at least a second insulating film, respectively,
depositing an electrically conductive electrode material film on a surface of the semiconductor substrate including said first and second insulating films,
forming a charge transfer electrode on said first insulating film of said solid-state image pickup region by patterning said electrically conductive electrode material film and an isolating electrode on said second insulating film of said peripheral circuit region, respectively,
wherein the step of patterning said electrically conductive electrode material film is followed by the step of burying a fourth insulating film between electrodes formed of said electrically conductive electrode material film including said charge transfer electrode and said isolating electrode, wherein
the step of burying the fourth insulating film between electrodes formed of said electrically conductive electrode material film including said charge transfer electrode and said isolating electrode is performed by
depositing said fourth insulating film made flowing by heat on the surface of said semiconductor,
flattening the surface of said fourth insulating film through heat treatment on said fourth insulating film, and
etching uniformly said fourth insulating film from a surface thereof to bury said fourth insulating film between said electrodes formed of said electrically conductive electrode material film including said charge transfer electrode and said isolating electrode.

26. A method for fabricating a solid-state image pickup device, comprising the steps of:
forming, in a solid-state image pickup region of a semiconductor substrate, a first diffusion layer for isolating a device from another in said solid-state image pickup region and in a peripheral circuit region other than the solid-state image pickup region of said semiconductor substrate, a second diffusion layer for isolating a device from another in said peripheral circuit region, respectively, forming, on a surface of the semiconductor substrate of said solid-state image pickup region, a first insulating film and on a surface of the semiconductor substrate of said peripheral circuit region, at least a second insulating film, respectively, depositing an electrically conductive electrode material film on a surface of the semiconductor substrate including said first and second insulating films, forming a charge transfer electrode on said first insulating film of said solid-state image pickup region by patterning said electrically conductive electrode material film and an isolating electrode on said second insulating film of said peripheral circuit region, respectively, wherein the step of forming, on the surface of the semiconductor substrate of said solid-state image pickup region, the first insulating film and on the surface of the semiconductor substrate of said peripheral circuit region, at least the second insulating film, respectively, comprises the step of forming, on the surface of the semiconductor substrate of said solid-state image pickup region, the first insulating film and on the surface of the semiconductor substrate of said peripheral circuit region, the first and second insulating films, respectively, in the step of forming the charge transfer electrode on said first insulating film of said solid-state image pickup region by patterning said electrically conductive electrode material film and the isolating electrode on said second insulating film of said peripheral circuit region, respectively, a gate electrode formed of said electrically conductive electrode material film of said peripheral circuit region is formed at the same time on said first insulating film of said peripheral circuit region, wherein
the step of patterning said electrically conductive electrode material film is followed by the step of burying a fourth insulating film between electrodes formed of said electrically conductive electrode material film including said charge transfer electrode and said isolating electrode, wherein
the step of burying the fourth insulating film between electrodes formed of said electrically conductive electrode material film including said charge transfer electrode and said isolating electrode is performed by
depositing said fourth insulating film made flowing by heat on the surface of said semiconductor,
flattening the surface of said fourth insulating film through heat treatment on said fourth insulating film, and
etching uniformly said fourth insulating film from a surface thereof to bury said fourth insulating film between said electrodes formed of said electrically conductive electrode material film including said charge transfer electrode and said isolating electrode.

27. A method for fabricating a solid-state image pickup device, comprising the steps of:
forming, in a solid-state image pickup region of a semiconductor substrate, a first diffusion layer for isolating a device from another in said solid-state image pickup region and in a peripheral circuit region other than the solid-state image pickup region of said semiconductor substrate, a second diffusion layer for isolating a device from another in said peripheral circuit region, respectively, forming, on a surface of the semiconductor substrate of said solid-state image pickup region, a first insulating film and on a surface of the semiconductor substrate of said peripheral circuit region, at least a second insulating film, respectively, depositing an electrically conductive electrode material film on a surface of the semiconductor substrate including said first and second insulating films, forming a charge transfer electrode on said first insulating film of said solid-state image pickup region by patterning said electrically conductive electrode material film and an isolating electrode on said second insulating film of said peripheral circuit region, respectively, wherein
the step of forming, on the surface of the semiconductor substrate of said solid-state image pickup region, the first insulating film and on the surface of the semiconductor substrate of said peripheral circuit region, at least the second insulating film, respectively, comprises the step of forming, on the surface of the semiconductor substrate of said solid-state image pickup region, the first insulating film and on the surface of the semiconductor substrate of said peripheral circuit region, the second insulating film and a third insulating film, respectively, and
in the step of forming the charge transfer electrode on said first insulating film of said solid-state image pickup region by patterning said electrically conductive electrode material film and the isolating electrode on said second insulating film of said peripheral circuit region, respectively, a gate electrode formed of said electrically conductive electrode material film of said peripheral circuit region is formed at the same time on said third insulating film of said peripheral circuit region, wherein
the step of patterning said electrically conductive electrode material film is followed by the step of burying a fourth insulating film between electrodes formed of said electrically conductive electrode material film including said charge transfer electrode and said isolating electrode, wherein
the step of burying the fourth insulating film between electrodes formed of said electrically conductive electrode material film including said charge transfer electrode and said isolating electrode is performed by
depositing said fourth insulating film made flowing by heat on the surface of said semiconductor,
flattening the surface of said fourth insulating film through heat treatment on said fourth insulating film, and
etching uniformly said fourth insulating film from a surface thereof to bury said fourth insulating film between said electrodes formed of said electrically conductive electrode material film including said charge transfer electrode and said isolating electrode.

28. A method for fabricating a solid-state image pickup device, comprising the steps of:
forming, in a solid-state image pickup region of a semiconductor substrate, a first diffusion layer for isolating a device from another in said solid-state image pickup region and in a peripheral circuit region other than the solid-state image pickup region of said semiconductor substrate, a second diffusion layer for isolating a device from another in said peripheral circuit region, respectively, forming, on a surface of the semiconductor substrate of said solid-state image pickup region, a first insulating film and on a surface of the semiconductor substrate of said peripheral circuit region, at least a second insulating film, respectively, depositing an electrically conductive electrode material film on a surface of the semiconductor substrate including said first and second insulating films, and forming a charge transfer electrode on said first insulating film of said solid-state image pickup region by patterning said electrically conductive electrode material film and an isolating electrode on said second insulating film of said peripheral circuit region, respectively, wherein the second insulating film is formed thicker than the first insulating film, and wherein the solid-state image pickup region has only the first insulating film provided thereon.

29. The method for fabricating a solid-state image pickup device according to claim 28, further comprising:

forming a third insulating film thinner than said the first insulating film on the surface of the semiconductor substrate in the peripheral circuit region.

\* \* \* \* \*